United States Patent [19]

Ontrop et al.

[11] Patent Number: 4,951,254
[45] Date of Patent: Aug. 21, 1990

[54] STATIC MEMORY UNIT HAVING A PLURALITY OF TEST MODES, AND COMPUTER EQUIPPED WITH SUCH UNITS

[75] Inventors: Hans Ontrop; Roelof Salters; Betty Prince; Thomas J. Davies; Cathal G. Phelan; Cormac M. O'Connell; Peter H. Voss, all of Eindhoven; Leonardus C. M. G. Pfennings, deceased, late of Eindhoven; by Henricus J. Kunnen, legal representative, Valkenswaard, all of Netherlands

[73] Assignee: U.S. Philips Corporation, New York, N.Y.

[21] Appl. No.: 272,180

[22] Filed: Nov. 16, 1988

[30] Foreign Application Priority Data

Nov. 20, 1987 [FR] France .................. 87 16115

[51] Int. Cl.[5] ..................... G11C 7/00; G11C 29/00
[52] U.S. Cl. .................... 365/201; 371/21.1; 371/57.2
[58] Field of Search ............ 365/201; 371/21

[56] References Cited

U.S. PATENT DOCUMENTS 4,811,299 3/1989 Miyazawa et al. ................. 365/201

Primary Examiner—James W. Moffitt
Attorney, Agent, or Firm—Jack D. Slobod

[57] ABSTRACT

Random access memory unit having a plurality of test modes, which is constructed as an integrated circuit and which does not include specific input/output pins to define and to command the passage to test mode. This unit is equipped with means (1) for detecting whether a predefined sequence of logic signals, which is not contained, within a set of sequences which are normally used, but the voltages of which are nevertheless included within the range of voltages which are specified for such signals, is supplied to certain inputs (CE, WE, AO), and for placing the unit in-test mode when such a sequence has been detected. In order to define the nature of the test to be performed, address input terminals, (A1–A8) of the unit are connected to a test mode decoding circuit (2), in which the data applied to the said input terminals are used as data defining the nature of the test to be performed.

15 Claims, 2 Drawing Sheets

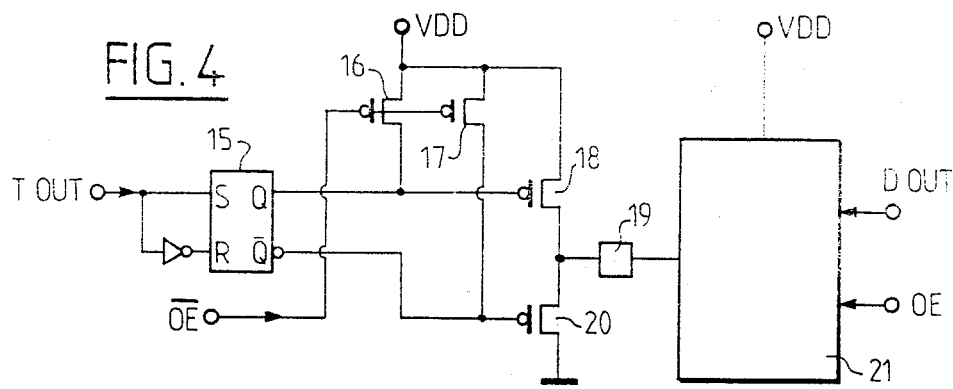
FIG. 4
FIG. 5
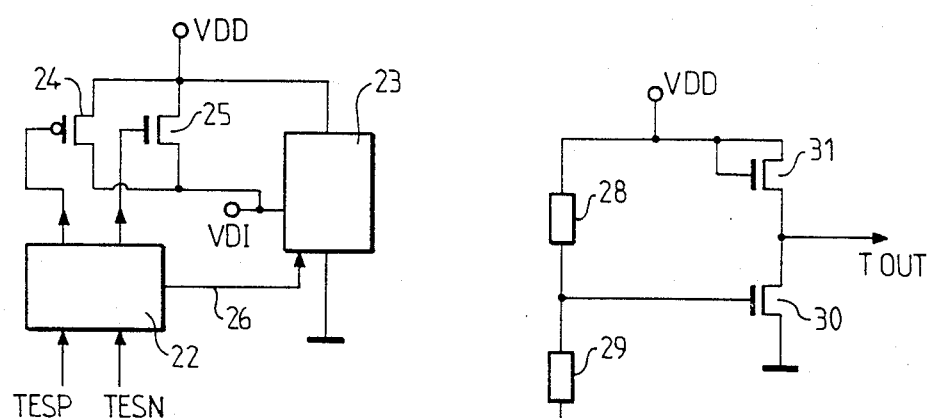
FIG. 6  FIG. 7

STATIC MEMORY UNIT HAVING A PLURALITY OF TEST MODES, AND COMPUTER EQUIPPED WITH SUCH UNITS

Background of the Invention

1. Field of the Invention

The invention relates to a random access memory unit with direct access, comprising a parallel multi-bit address input and at least one data output, a read-write input, and a unit selection input.

2. Description of the Prior Art

In such memories, an attempt is always made to limit to the minimum possible the number of the connections between the memory and the external circuits, that is to say the number of pins of the case. It would not be profitable to provide additional connections permitting a particular test mode, these being connections which would no longer be utilized in normal use, that is to say during the greater part of the time.

It is known, in the field of dynamic memories (that is to say requiring a periodic "refresh") to trigger the passage to test mode by means of excess voltages applied to certain pins. This process may become inapplicable for various reasons, especially because the physical characteristics of the semiconductors limit the value or the duration of the applicable excess voltage. Moreover, the application of excess voltages at the location of use requires additional devices to produce and to apply these excess voltages.

Summary of the Invention

The invention provides a memory unit which may be adapted to a particular test mode, by virtue of internal modifications of the memory, without using supplementary pins for this purpose, and without using excess voltages of any kind.

A memory unit according to the invention is noteworthy in that it is equipped with means for detecting whether a predefined sequence of logic signals, which is not contained within a set of sequences which are normally used, but the voltages of which are nevertheless included within the range of voltages specified for such signals, is provided at certain inputs, and for placing the unit in test mode when such a sequence has been detected.

In order to avoid a situation in which certain accidental situations, especially on energizing the supplies, may be interpreted as a command to pass to test mode, advantageously the means for placing the unit in test mode act only when the said predefined sequence of logic signals comprises two successive violations of the specifications of a normal set of sequences.

A "prohibited" sequence which is simple and easy to implement consists in modifying at least one address bit while the unit has been placed in write mode. It is sufficient, especially, to modify only one of the address bits in order to create a "prohibited" situation and to trigger the passage to test mode.

The invention is particularly applicable to the memories for which changes of address during a write or read cycle are prohibited, for example those known under the acronyms: SRAM, EPROM, EEPROM, DRAM.

Such a sequence does not create an obligation to force a potential, and involves no risk of damaging a circuit. Moreover, it is very easy to decode.

Advantageously, the unit comprises means for maintaining it in test mode while the unit selection and write mode inputs do not simultaneously receive a deactivation signal.

It is useful to be able to execute a plurality of different tests. Instead of using a different triggering mode for each type of test to be executed, it is judicious to provide only two modes, that is to say: normal functioning mode/test mode, and to use, once the test mode is established, a set of inputs in a function which is different from their normal function in order to select, from among the plurality of possible test modes, which is the test mode which is to be established.

To this end, at least one address input terminal of the unit is connected to a test mode decoding circuit, in which the data applied to the said input terminal are used as data defining the nature of the test to be performed when the unit is placed in test mode.

Certain ones of the test modes imply that it is possible to continue to use the memory in the customary manner, while it is in test mode. This is entirely possible with the arrangement of the invention, since none of the sequences encountered in normal use has any effect on the test mode, except that which causes departure therefrom, and which involves the deactivation of the unit. As the memory can be used in the customary manner, output data may be presented, which run the risk of interfering with data resulting from the test. In order to avoid this, the unit which is equipped with a buffer circuit for the output of the data contained within the memory cells is further equipped with a second buffer circuit for the output of the data resulting from a test, which is activated in test mode, the outputs of the buffer circuits both being connected to the data output of the unit, and the output of that one of the two which is not active being in the high-impedance condition.

In the memories organized by bits, there is only a single data output pin, while the results emanating from a test may represent more than two possibilities, that is to say may be represented by a code having a plurality of bits. In order to solve this problem, a unit according to the invention is equipped with means for serializing the data resulting from a test, the write mode input of the unit being connected to these means in order to serve them as clock input.

In test mode, the unit according to the invention may, especially:

* present to a user information concerning the identification of the unit. This information is necessary because the test procedures may depend upon the origin of the unit to be tested. The possibility of automatically reading this information from the connections of the unit avoids having to input it manually at the keyboard of the test system.
* present to a user information on the use or the non-use of substitute circuits: as it is quasi-possible to produce a memory without any defect, substitute circuits are provided, which are set up at the conclusion of a first test, in order to replace the defective elements. This setting-up is achieved in a permanent and final manner, and is "transparent", that is to say that it is not possible to detect, in practice, any difference of behaviour of the unit. Nevertheless, certain users wish to know whether the unit on which they have their hands is or is not making use of such replacements.
* modify the voltage of an internal supply connection, on which a generator of a supply voltage intended for one or more subassemblies of the unit produces a regulated voltage. For example, in order to obtain a more certain operation of the memory, the network of memory cells is supplied by a regulated supply which is provided even within the unit. In order to carry out reliability tests an attempt is frequently made to accelerate the degradadation processes, especially by increasing the supply voltage. It may also be desired, in order to characterize the electrical behaviour, to note the variations of certain parameters of the function of the supply voltage. This is not possible a priori on account of the fact that the regulated internal supply is not accessible. For this reason, it is useful to provide that, in one of the test modes, the internal supply of the network is more or less directly connected to the external general supplies.
*proceed with a self-check.

A computer equipped with a plurality of memory units according to the invention is advantageously equipped with means for selectively addressing each unit and placing it in test mode. If the units are equipped with a self-check facility, the computer is advantageously equipped with means for giving self-check commands successively to each one of the said memory units, in order then to determine a predefined time period, and, on expiry of the said time period, to read successively the data presented at the output of each one of the memory units in the same order and with the same sequential pattern as those used to give the self-check commands. This secures the advantage that the total time for checking all the memories is only slightly greater than the time for checking a single memory, that is to say, far shorter than if the computer had itself to manage the steps of this check, this taking place for each memory, turn by turn.

Access to the test mode may be utilized in a plurality of environments:

functional test on the premises of the manufacturer
reception test on the premises of the customer
test after incorporation in an equipment, by the customer of the equipment.

In the majority of the possible test modes, it is always possible to have access to the unit as to a normal memory, with the exception of the sequence which causes departure from the test mode.

A unit according to the invention is advantageously constructed in the form of a monolithic integrated circuit.

The description which will follow, with reference to the accompanying drawings describing non-limiting examples, will provide a good understanding of how the invention may be implemented.

Brief Description of the Drawings

FIG. 4 represents an embodiment of the elements referenced 5 and 7 in FIG. 1.

FIG. 5 is a time diagram illustrating the serialization of information.

FIG. 6 represents an embodiment of the element referenced 4 in FIG. 1.

FIG. 7 represents an embodiment of the means for giving indications as to the use of substitute circuits.

Detailed Description of the Preferred Embodiments

Figure 1:
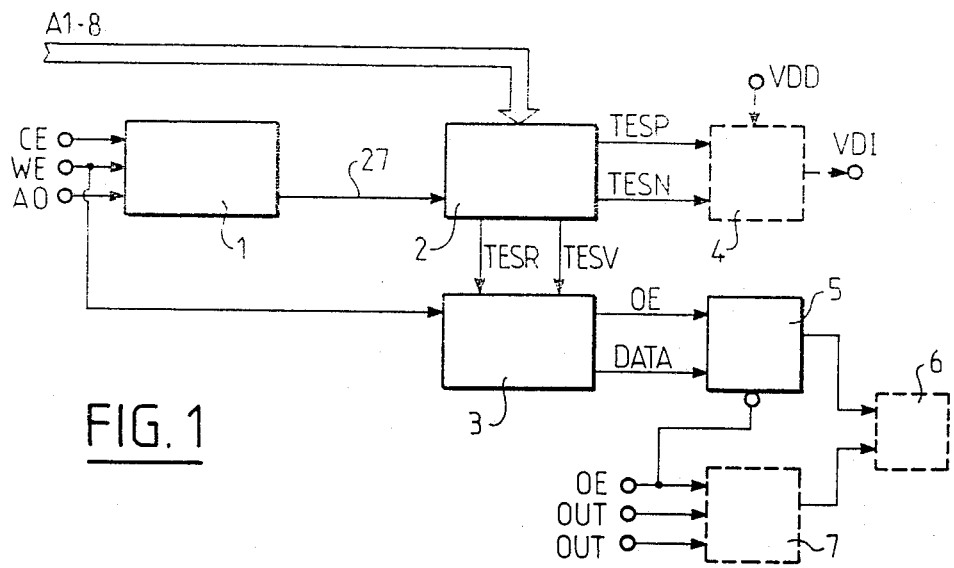
FIG. 1 diagrammatically represents the assembly of the means according to the invention.

The memory unit which serves as an example for the description which will follow is a static memory unit, that is to say that its memory cells consist of a flip-flop for each bit, which can permanently remain in one condition. without requiring periodic refresh. It has direct access, that is to say that it is possible to have access immediately to any bit of the memory by means of its address. In this case, it is organised by bits and has a capacity of 256 K×1. It therefore possesses inputs which are capable of addressing 256 K, i.e. 18 pins, numbered from "A0" to "A17". It furthermore possesses two supply pins ("earth" and "VDD"), an input pin for data to be stored "DIN", an output pin for data "DOUT", a unit selection input pin "CE" and a write-mode input pin "WE"; this makes a total of 24 pins. It is clearly evident that the means which will be described hereinbelow might be applied to other units, the capacity and/or the organization of which would be different. FIG. 1 represents in solid line the elements incorporated in the unit and which are specific to the invention and in broken lines known elements forming part of the unit. Address inputs "A9" through "A17" and data input "DIN" are not shown, while element 6 in effect corresponds to the external data output "DOUT" of the memory unit. The element referenced 1 is connected to the input CE, WE and to the address pin A0. It constitutes means for triggering the test mode. It detects whether a predefined sequence of logic signals which is customarily prohibited, that is to say not contained within a set of sequences which are normally used, but the voltages of which are nevertheless included within the range of voltages which are specified for such signals is supplied on the inputs WE, CE, A0. If such a sequence is detected, it supplies a signal for placing in test mode to the element 2.

With regard to the inputs WE, CE, it is recalled that, for reasons associated with the technology, use is frequently made of commands which are valid for the value zero: thus, the notation $\overline{CE}$ representing the inverse of CE, the command $\overline{CE}=0$ is equivalent to the command CE = 1. The pin CE serves to select one unit from among a plurality of units: when CE=0 the unit is not in service, its data output DOUT is in the high-impedance condition for (the outputs of all the units being connected together) not obstructing the output of that one of the units for which CE=1, and which is therefore "selected".

Figure 2:
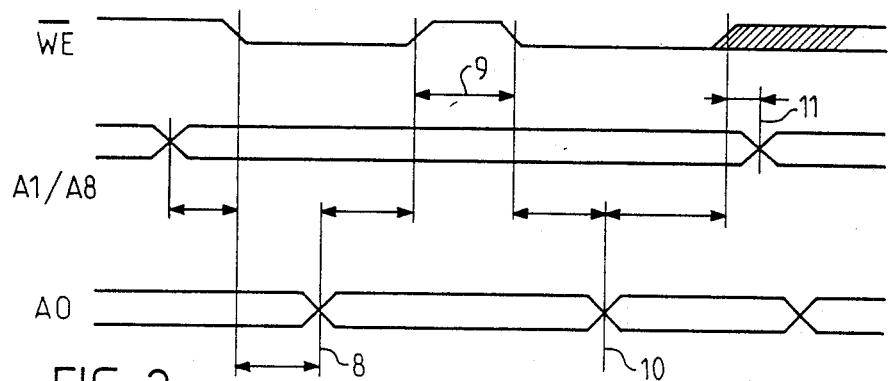
FIG. 2 represents a diagram of signals constituting a sequence triggering the placing in test mode.

By way of prohibited sequence, the sequence illustrated in FIG. 2 has been selected. First of all, the connection $\overline{CE}$ passes to or remains at zero, and the unit is therefore selected. At this moment, the addresses A1-A8 are established or have already been established. Subsequently, the connection WE also passes to zero. This means that the write mode is established: the passage of WE to zero is a signal which triggers, in the memory, the recording of the data item present on the data input (not represented), in the memory cell which corresponds to the address presented on the address inputs A0-A17. It is self-evident that at the time when the command is given to send a data item to a certain address this address must no longer be modified. Such a modification therefore constitutes a sequence which is customarily prohibited. In practice, it is sufficient to change a single one of the 18 address bits to constitute a prohibited sequence. In this case, the input A0 has been selected to trigger the test mode. When A0 is inverted at the time referenced 8 the test mode may be triggered. Nevertheless, in order to increase the security, it has been chosen to provide a redundancy, that is to say that it is desired to activate the test mode only when the sequence comprises two successive violations of the specifications of a normal set of sequences. Accordingly, $\overline{EW}$ is raised again to 1 during the duration 9, and then it is reduced to zero before once again changing AO at the time 10. The test mode is then triggered.

It should be noted that, instead of again raising $\overline{WE}$ between the two modifications of AO, it would also have been possible to raise $\overline{CE}$ again; this would also create a placing in write mode at the end of the time 9. The selection of the pins AO, WE, CE is arbitrary, and in certain cases it would be possible to choose others, provided that they permit the application of an unexpected sequence. For example, certain memories possess a supplementary authorization pin to command the output ("Output Enable") and the activation of this pin during a write cycle might be used to trigger the passage to test mode.

The provision of the signal sequence detector element 1 by means of the basic logic circuits is elementary to a person skilled in the art, for example by means of a R/S flip-flop recording the passage to zero of WE and of CE and consequently authorizing a D flip-flop to detect the transistion on AO, the latter flip-flop having an output which authorizes the activation of a second identical group which will detect the second sequence WE, AO, and will store a signal for activation of the test mode, to be supplied on the connection 27.

Figure 3:
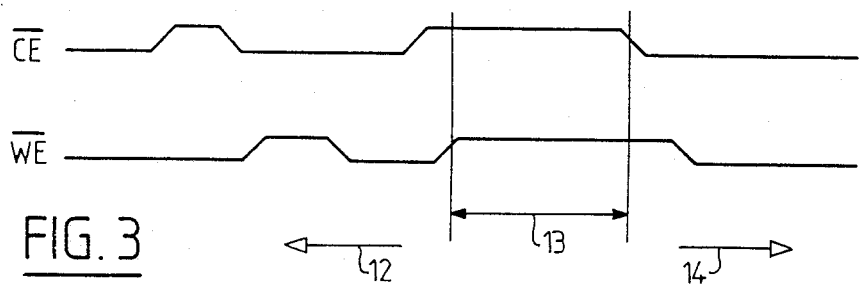
FIG. 3 represents a diagram of signals constituting a sequence which causes departure from the test mode.

The element 1 also contains means for detecting the sequence represented at 13 in FIG. 3. During the period indicated by 12, the input WE or CE may include signal parts indicating a deactivation ($\overline{WE}=1$, or $\overline{CE}=1$) but not together, and the unit is maintained in test mode. When, as indicated at 13, the unit selection input CE and the write mode input WE simultaneously receive a deactivation signal, after a delay to confirm the sequence, the test condition is abandoned and the signal changes on the connection 27. Here again, the means for detecting such a sequence are readily provided by a person skilled in the art on the basis of basic logic elements, for example by means of an AND gate to detect $WE \times CE = 1$, associated with a time delay circuit.

The element 2 is a test type decoding circuit which receives from the connection 27 the signal for placing in test mode, and is furthermore connected to a set of address input pins of the unit, in this case the set A1–A8, and the data applied to the said input pins are used as data defining the nature or type of the test to be performed. The element 2 is a kind of demultiplexer which, based on the address word A1–A8, generates a signal on one connection from among n connections, which are each connected to a specialized circuit in accordance with the test to be performed. With the eight address bits A1–A8 it would be possible to define 256 different test modes. In practice, it is sufficient in the present example, to use four of them. The element 2 comprises an OR circuit having six inputs, by means of which circuit (not shown) it is verified that the bits A3–A8 are all at zero, and a "two to four" demultiplexer which, depending upon the combination of the bits A1 and A2 generates a signal on one and only one of the four connections TESP, TESN, TESR TESV.

As has been indicated in the introduction, it is useful to be able to act on the internal supply of the network of memory cells. This is obtained by means of the supply voltage generator element 4, to which the connections TESP and TESN lead.

This element is represented in greater detail in FIG. 6. It comprises a circuit 23 which generates from the general supply voltage VDD, the regulated voltage VDI which is applied to the memory cells. This circuit may be put out of service, that is to say that it then no longer imposes the voltage VDI or indeed its voltage can be modified, when it receives an ad hoc signal on one logic connection 26. The principal drainsource paths of two transistors 24 and 25 are in parallel with one another connect the supply connection VDD to the supply connection VDI. These two transistors are of very large size, for example 1000 times broader than a memory cell transistor.

The assembly of the memory is performed in "complementary "MOS" technology, and the transistor 24 is in this case of P type, while the transistor 25 is of the N type. The voltage VDD is, of course, positive. When the signal TESP is active, the command logic circuit 22 generates a low voltage on the gates of the two transistors 24 and 25; the P type transistor 24 is therefore conductive and the N type transistor is blocked. The voltage VDI is then connected without threshold to the voltage VDD. When it is the signal TESN which is active, the command circuit 22 generates a high voltage on the two gates 24, 25: the P type transistor 24 is blocked and the N type transistor 25 is conductive, but introduces a voltage difference ("threshold voltage") between VDD and VDI.

When, finally, neither of the signals TESP or TESN is active, the circuit 22 generates a high voltage on the gate of the transistor 24, and a low voltage on the gate of the transistor 25, which are then both blocked. This circuit 22 may be constructed easily with the aid of a few logic ports.

When it is desired to use one of the substitute circuits provided initially by way of redundancy, their activation is achieved, for example, by burning of a resistor placed at the foot of a bridge between VDD and earth. On account of the cut-off of the base resistance, the voltage of the centre of the bridge becomes equal to VDD and if it is, for example, applied to the gate of an NPN transistor, the latter becomes conductive. This explains how it" is possible to close a circuit by cutting a conductor. The circuit according to the invention comprises a specialized circuit, one embodiment of which is given in FIG. 7. It comprises a bridge of resistors 28, 29, the ratio of which is such that the voltage of the centre is less than the threshold voltage of the N type transistor 30, to the gate of which the said centre is connected. The transistor 31 fulfills the function of resistance; it is of very small size. In the course of the operation of placing in service one of the substitute circuits provided, the resistor 29 is furthermore burned; this makes the transistor 30 conductive and places a zero on the test output TOUT.

When identification information is desired on the memory, for example, a code identifying the production establishment of the unit and/or the name of its vendor, and/or the date of production etc., this information is a word consisting of more than two bits. As there is only one data output pin, the information must be provided in series. To this end, the unit is equipped with means for serializing the data resulting from a test. In order to do this, it is necessary to have available a clock. To this end, the write mode input WE is connected to these means in order to serve them as a clock, and the latter is supplied from outside on the pin WE. The result is indicated in FIG. 5. The input WE serves as clock and the line DOUT carries the resulting signal, in this case for example 110101000111.

The specific test circuits described hereinabove are contained within the test data generator element 3 of FIG. 1, to which element the clock WE is guided, and the connections TESR and TESV trigger respectively the redundancy test and the supply of the data concerning the vendor of the memory.

When redundancy test or identification data are ready in the element 3, a signal is supplied to the connection OE and then the data appear on the connection DATA. In order to prevent any interaction between these data and those resulting from the normal use of the memory, which is also possible in a test period, especially to characterize the behaviour of the memory cells, as has been indicated in the introduction, an output buffer circuits is provided specifically for the data resulting from a test. This circuit is represented in FIG. 4. A R/S flip-flop 15 maintains the data item input on TOUT. Its output Q is connected to the gate of a P type transistor 18, the current path of which is branched between VDD and the external data output of the unit (corresponding to element 6 in FIG. 1), the metallization area of which is symbolized by a square 19. The other output $\bar{Q}$ of the flip-flop 15 is connected to another P type transistor 20, the current path of which is connected between the output 19 and earth. The signal $\overline{OE}$ authorizing the test data output is guided to the gates of two P type transistors 16, 17 connected between VDD and, respectively, the output Q and the output $\bar{Q}$ of the R/S flip-flop. It is assumed that the outputs Q and $\bar{Q}$ have a fairly high internal impedence, so that the transistors 16 and 17 can impose, when they are conductive, a voltage close to VDD on Q and $\bar{Q}$. Consequently, if $\overline{OE}$ equals O, the transistors 16, 17 are conductive, and the two transistors 18 and 20 are blocked, the output of the assembly then being at high impedance. With $\overline{OE}$=VDD, which corresponds to the test mode, the output Q and $\bar{Q}$ are free and only one of the two transistors 18 or 20 is conductive, depending on the value of TOUT. The reference 21 designates another block with may possibly be identical to the assembly 15–20 described hereinabove corresponding to the memory data output buffer 7, in FIG. 1, and serves for the output of the data contained within the memory cells, in the course of the normal use of the unit. The output data of the memory cells are guided to the terminal DOUT, and the block is commanded by the signal OE, the inverse of $\overline{OE}$: thus, only one of the two blocks |15–20| or 21 is active at a time. Moreover, if CE=0 at the input of the unit, the two signals OE and $\overline{OE}$ are both at zero. In practice, the block 21 comprises, in relation to the assembly 15–20, additional elements which do not form part of the invention and serve, in particular, to increase the output speed of the memory data. On the other hand, an increase in output speed of the test data is not particularly necessary.

A description has been given hereinabove of four different test modes, the selection of which is undertaken at the input by means of the bits A1–A2. With a larger number of bits, a large number of types of test may be selected by means of the address connections. A test which is of interest consists, in particular, in a self-check of the memory cells. When this test is triggered, a counter, forming part of the test circuits, counts from 1 to 256K and its count result serves as address to indicate a memory cell to be checked. A circuit which delivers the signals necessary for the checking of a cell is triggered on each occasion for each new cell address, and if one of the checks proves to be negative, a "semaphore" flip-flop is triggered to store in memory the fact that a fault has been encountered. During the self-check period, a clock intended to drive the process is supplied, for example, on the input terminal WE as in the case of the serialization of the output data. Another terminal might also be selected for this purpose, for example one of the address terminals A11–A17 which are unused during this test. These self-check circuits do not represent a significant addition from the point of view of the area required on the semiconductor crystal, the unit being, of course, constructed in the form of a monolithic integrated circuit.

When units according to the invention are used in a computer, the latter may be equipped with means for selectively addressing each unit and placing it in test mode. If the units are equipped with a self-check system the computer is advantageously equipped with means for giving self-check commands successively to each one of the said memory units and for then determining a predefined time period. The time period in question corresponds to the time necessary for the self-check of one of the memories. As they are all identical, their test results will become available in the order of their initial triggering and the computer will therefore be able, at the end of the said period of time, to read successively the data presented at the output of each one of the memory units in the same order and with the same cyclic sequence as those used to give the self-check commands.

We claim:

1. A random access memory unit with direct access, comprising a parallel multi-bit address input and at least one data output, a write mode input for placing the unit in write mode, a unit selection input, and means for detecting whether a predefined sequence of logic signals, which violates specifications for said unit of a normal set of sequences which are used for said direct access so as to be normally prohibited, but the amplitudes of which are nevertheless included within a range of amplitudes specified for such signals, is supplied at said multi-bit address input and said write mode input, and for placing the unit in test mode when such predefined sequence has been detected wherein the predefined sequence comprises a modification of at least one of only the address data bits at said multi-bit address input while the unit has been placed in write mode, this constituting an aforesaid normally prohibited sequence.

2. The memory unit according to claim 1, characterized in that the means for placing the unit in test mode act only when the said predefined sequence of logic signals comprises two successive violations of the specifications of a normal set of sequences.

3. The memory unit according to claim 1, characterized in that the means for placing the unit in test mode act in consequence of the modification of only one of the address bits.

4. The memory unit according to any one of claims 1, 2, and 4 characterized in that it further comprises means for maintaining it in test mode while the unit selection and write mode inputs do not simultaneously receive a deactivation signal.

5. The memory unit according to any one of claims 1, 2, and 4, wherein said unit has a plurality of test modes and wherein said detecting and placing means is characterized in that input terminals for one or more bits of said multi-bit address input of the unit is connected to a test mode decoding circuit, in which the one or more bits are used as data defining the particular test mode into which the unit is to be placed.

6. The memory unit according to claim 1, further comprising a first buffer circuit for the output of the data contained within the memory cells, characterized in that it is further equipped with a second buffer circuit for the output of the data resulting from a test, which is activated in test mode, the outputs of both buffer circuits being connected to the data output of the unit, and, at least one buffer output of the two being in the high-impedance condition, in response to whether or not the unit is in test mode.

7. The memory unit according to any one of claim 1 which is equipped with a single data output pin, characterized in that said unit is equipped with means for serializing the data resulting from a test, the write mode input of the unit being connected to these means in order to serve them as clock input.

8. The memory unit according to claim 1 characterized in that it is equipped with means for supplying to a user, in test mode, information concerning the identification of the unit.

9. The memory unit according to claim 1 which is equipped with substitute circuits intended to be permanently used in place of normal circuits in the event of failure of one or more of the latter, characterized in that it is equipped with means for supplying to the user, in test mode, information concerning the use of or non-use of a substitute circuit.

10. The memory unit according to claim 1 which is equipped with an internal voltage generator operating from a supply input of the unit, intended to supply one or more subassemblies of the unit and producing, on an internal supply connection, a regulated voltage, characterized in that it is equipped with means for modifying the voltage applied to the said internal supply connection, in test mode.

11. The memory unit according to claim 10, characterized in that the said means establish a link between the said internal supply connection and the supply input of the unit.

12. The memory unit according to claim 1 characterized in that it is equipped with means for carrying out a self-check, in test mode.

13. The computer equipped with a plurality of memory units according to claim 12, characterized in that it is equipped with means for giving self-check commands successively to each one of the said memory units, in order then to determine a predefined time period, and in order, on the expiration of the said time period, to read successively the data presented at the output of each one of the memory units, in the same order, and with the same cyclic sequence as those used to give the self-check commands,.

14. The computer equipped with a plurality of memory units according to claim 1 characterized in that it is equipped with means for selectively addressing each unit and placing it in test mode.

15. The unit according to claim 1 characterized in that it is constructed in the form of an integrated circuit.

* * * * *